United States Patent
Coakley et al.

(10) Patent No.: US 8,705,222 B2
(45) Date of Patent: Apr. 22, 2014

(54) COMPENSATING TEMPERATURE EFFECTS IN MAGNETIC ACTUATORS

(75) Inventors: Scott Coakley, Belmont, CA (US); Michael B. Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 126 days.

(21) Appl. No.: 12/463,496

(22) Filed: May 11, 2009

(65) Prior Publication Data

US 2010/0284119 A1 Nov. 11, 2010

(51) Int. Cl.
*H01H 47/00* (2006.01)
(52) U.S. Cl.
USPC .......................................... 361/140
(58) Field of Classification Search
None
See application file for complete search history.

(56) References Cited

U.S. PATENT DOCUMENTS

| 7,446,494 | B2 * | 11/2008 | Grabinger et al. | 318/471 |
| 2004/0095219 | A1 * | 5/2004 | Kelly | 335/229 |
| 2005/0109400 | A1 * | 5/2005 | Glime et al. | 137/334 |
| 2008/0084173 | A1 * | 4/2008 | Grabinger et al. | 318/432 |
| 2008/0309911 | A1 * | 12/2008 | Maria De Vos et al. | 355/72 |
| 2009/0111651 | A1 * | 4/2009 | Gale et al. | 477/98 |

\* cited by examiner

*Primary Examiner* — Rexford Barnie
*Assistant Examiner* — Terrence Willoughby

(57) ABSTRACT

Methods and apparatus for adjusting the amount of current provided to a magnetic actuator to compensate for a temperature change associated with the magnetic actuator are disclosed. According to one aspect of the present invention, an apparatus includes an actuator, which has at least one magnet and an associated force constant. The apparatus also includes a temperature sensing arrangement and a control arrangement, the temperature sensing arrangement being arranged to determine or measure a temperature of the magnet. The control arrangement adjusts the current provided to the actuator based on the temperature of the magnet. The current is adjusted to maintain a correct or desired force in light of temperature-induced variations to a force constant.

22 Claims, 8 Drawing Sheets

| MAGNET TEMPERATURE | FORCE CONSTANT | COMPENSATING CURRENT GAIN |
|---|---|---|
| T | K | $K_i$ |

FIG. 5

COMPENSATING TEMPERATURE EFFECTS IN MAGNETIC ACTUATORS

BACKGROUND OF THE INVENTION

1. Field of the Invention

The present invention relates generally to actuators. More particularly, the present invention relates to compensating for temperature effects associated with magnets used in actuators.

2. Description of the Related Art

The ability to maintain accuracy in precision motion applications is critical. If the accuracy of a precision motion application such as a photolithography application is compromised, for example, the integrity of a wafer processed by the photolithography application may be compromised. The accuracy of precision motion applications may generally be adversely affected by a variety of disturbances including, but not limited to including, vibrations.

To substantially minimize the adverse effects of disturbances on precision motion applications, precision motion applications may incorporate systems which are arranged to compensate for the disturbances. By way of example, to reduce the effects of vibrations in a photolithography apparatus, an active vibration isolation system may be incorporated into the photolithography apparatus to substantially dampen the vibrations. Active vibration isolation systems are generally effective in dampening vibrations associated with a photolithography apparatus. As the ability to dampen vibrations which may adversely affect the performance of a photolithography apparatus improves, the effect of other types of disturbances on the photolithography apparatus is becoming more prevalent.

Therefore, what is needed is a method and a system which compensates for disturbances that affect precision motion applications. That is, what is desired is a method and a system which increases the accuracy of precision motion applications by compensating for disturbances that would generally have an undesirable effect on the accuracy.

SUMMARY OF THE INVENTION

The present invention pertains to measuring the temperature of magnets included in electromagnetic actuators, and maintaining a substantially constant force constant in the actuators by compensating for changes in temperature. The present invention may be implemented in numerous ways, including, but not limited to, as a method, system, device, apparatus, hardware logic, and/or software logic. Example embodiments of the present invention are discussed below.

According to one aspect of the present invention, an apparatus includes an actuator, which has at least one magnet and an associated force constant. Typically, the force constant, e.g., Newtons per Ampere, of the actuator changes slightly with changes in the magnet temperature. The apparatus also includes a temperature sensing arrangement and a control arrangement. The temperature sensing arrangement being arranged to determine or measure a temperature of the magnet. The control arrangement adjusts the current provided to the actuator based on the temperature of the magnet. The current is adjusted to counteract the change in the force constant, and thereby maintain the output at a desired value. In one embodiment, the temperature sensing arrangement is configured to measure the temperature of the magnet in real-time and to provide the temperature of the magnet to the control arrangement.

According to another aspect of the present invention, a stage apparatus includes a stage, a magnetic actuator, a temperature sensing arrangement, and a control arrangement. The magnetic actuator includes at least one magnet and has an associated actuator force constant. The magnetic actuator is coupled to the stage and configured to cause the stage to move. The temperature sensing arrangement is configured to measure a temperature associated with the magnet. The control arrangement provides an amount of current to the magnetic actuator, and obtains the temperature measured by the temperature sensing arrangement. The control arrangement also adjusts the amount of current provided to the magnetic actuator based on the temperature measured by the temperature sensing arrangement to maintain the actuator force at a desired level, e.g., a first value.

In accordance with still another aspect of the present invention, a method for operating a stage apparatus which includes an actuator involves determining a first temperature of a magnet associated with the stage apparatus. The method also includes determining an amount of current to provide to the actuator. Such an amount of current is selected to enable the actuator to sustain an actuator force at a desired value when the magnet is at the first temperature. Finally, the method includes providing the amount of current to the actuator.

Other aspects of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which:

FIG. 5 is a diagrammatic representation of a compensation table in accordance with an embodiment of the present invention.

DETAILED DESCRIPTION OF THE INVENTION

Figure 1:
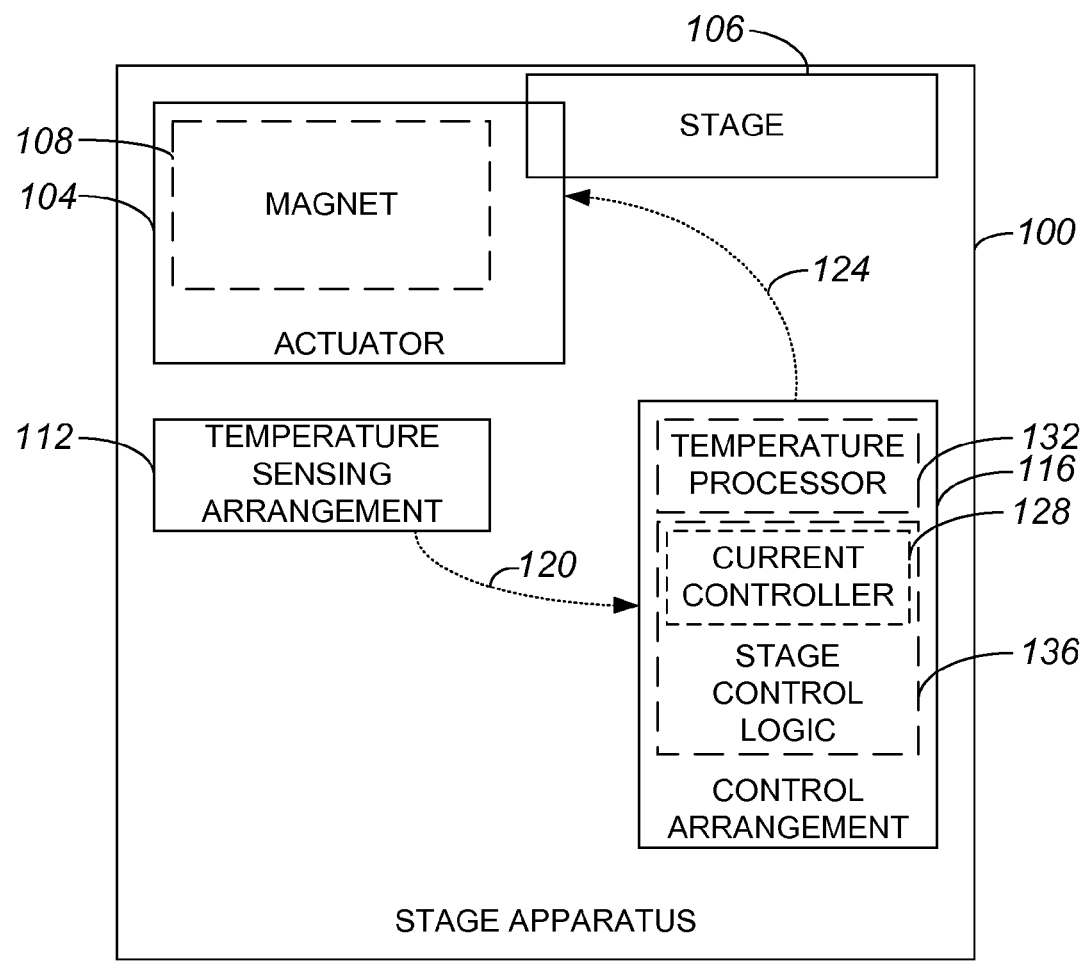
FIG. 1 is a block diagram representation of a stage apparatus that includes a control arrangement which compensates for temperature effects in a magnetic actuator in accordance with an embodiment of the present invention.

Example embodiments of the present invention are discussed below with reference to the various figures. However, those skilled in the art will readily appreciate that the detailed description given herein with respect to these figures is for explanatory purposes, as the invention extends beyond these embodiments.

In precision applications which use actuators, e.g., electromagnetic actuators, the ability to accurately control the force produced or generated by such actuators is crucial. For instance, in a relatively high precision motion application that involves lithography stages, if the force outputted by electromagnetic actuators is not relatively accurately controlled, the integrity of a lithography process may be compromised. That is, if the actual force provided by an actuator associated with a lithography stage is higher or lower than expected, the integrity of a wafer processed using the lithography stage may effectively be compromised.

As the temperature of a magnet included in an electromagnetic actuator changes, the actuator force constant associated with the electromagnetic actuator may change. By way of example, when the temperature of a magnet included in an electromagnetic actuator rises, the strength of a magnetic field associated with the magnet drops and, hence, the actuator force constant of the actuator also drops. The amount of force generated by the actuator is affected because the force constant, which may be measured in Newtons per Amp, associated with the actuator changes when the temperature of magnets used by the actuator changes.

By compensating for temperature effects in magnetic actuators, the force outputted by the actuators may effectively be controlled. In other words, measured temperature data may be used to determine an amount by which a current provided to each actuator may be adjusted in order to achieve a particular actuator force. It should be appreciated that given an amount by which a force constant changes, an offsetting change in current supplied to the actuator may be provided. The measured temperature data may be used to allow an amount of current provided to each actuator to be adjusted as appropriate to offset the temperature-induced change in the force constant for each actuator. When the actuator force maintains a desired value despite fluctuations in the temperature of a magnet associated with the actuator, the performance of the actuator is enhanced.

In one embodiment, a thermal camera may be used to measure the temperature of a magnet of an electromagnetic actuator. A thermal camera, which may be a high or low resolution infrared (IR) imager, may measure the temperature of a magnet used by an electromagnetic actuator, and then provide the temperature to a controller that adjusts an amount of current provided to the actuator. The amount of current provided to the actuator may be adjusted to maintain a desired actuator force. By way of example, when the temperature of the magnet rises, the amount of current applied to the actuator may be increased as needed to maintain the actuator force at a desired level.

Referring initially to FIG. 1, a stage apparatus within which a temperature of an actuator magnet is measured and compensated for will be described in accordance with an embodiment of the present invention. A stage apparatus 100, which may be part of an overall photolithography system, includes an actuator 104 which is configured to allow a stage 106 of stage apparatus 100 to translate. Stage 106 may arranged to support a reticle or a wafer. In other words, stage 106 may be a reticle stage or a wafer stage.

A control arrangement 116 includes stage control logic 136 that is arranged to control the movement of stage 106 by substantially controlling actuator 104. Stage control logic 136, which may include hardware and/or software logic, includes a current controller 128 which is configured to control or otherwise adjust the amount of current provided to actuator 104.

Actuator 104 may be an electromagnetic actuator that includes a magnet 108, e.g., a permanent magnet or an electromagnet. Actuator 104 may generally be an electromagnetic actuator including, but not limited to including, a voice coil motor (VCM), an E-core motor, a planar motor, and a linear motor. The temperature of magnet 108 may be monitored and measured substantially in real-time by a temperature sensing arrangement 112. Temperature sensing arrangement 112 may be a thermal camera arrangement, as will be described below with respect to FIG. 2, or a temperature sensor that is effectively directly coupled to magnet 108, as will be discussed below with respect to FIG. 3.

Temperature sensing arrangement 112 provides temperature measurements to control arrangement 116. Using the temperature measurements, a temperature processor 132 included in control arrangement 116 determines an amount of current to be provided to actuator 104. In one embodiment, the temperature measurements may be used by control arrangement 116 to adjust the amount of current provided to actuator 104 such that a desired actuator force may be maintained or sustained. It should be appreciated that by compensating for temperature-induced changes in the actuator force constant, a desired amount of force may be applied by or otherwise generated by actuator 104.

Figure 2:
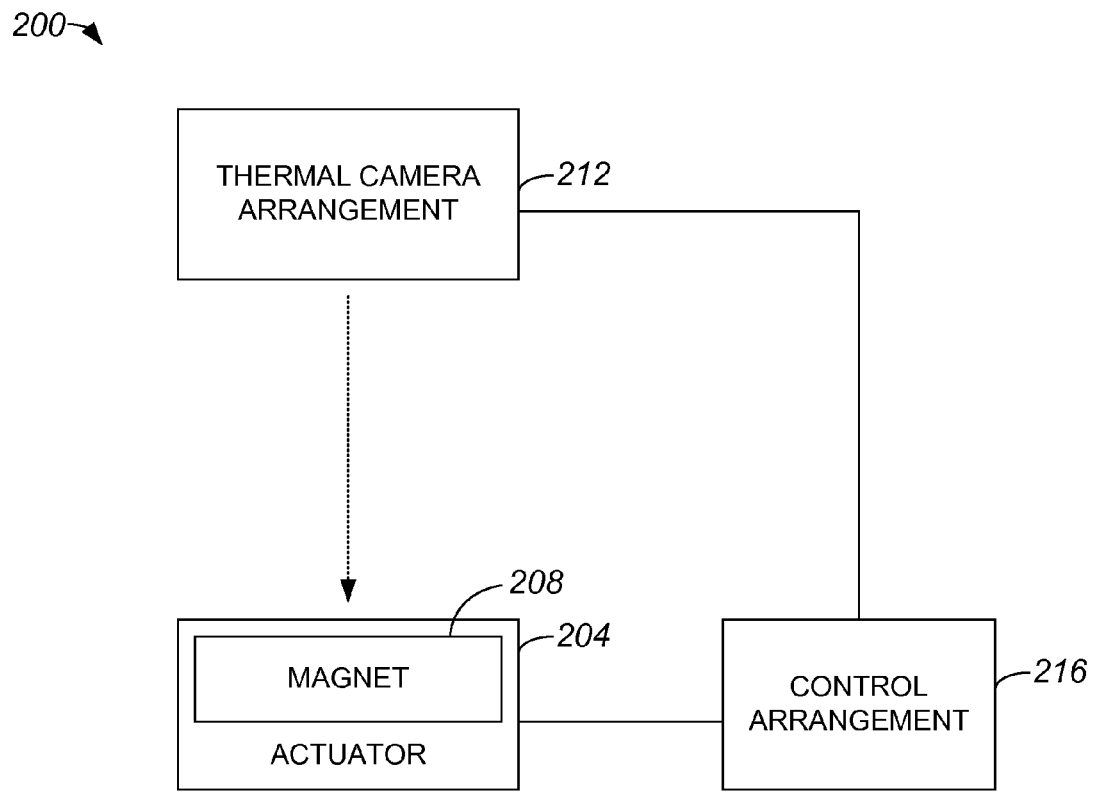
FIG. 2 is a diagrammatic representation of a stage apparatus that includes a thermal camera arrangement which provides a non-contact temperature measurement associated with a magnetic actuator in accordance with an embodiment of the present invention.

As mentioned above, a temperature sensing arrangement such as temperature sensing arrangement 112 may be a thermal camera arrangement. The thermal camera arrangement may be positioned in the vicinity of, e.g., substantially over, a magnet such that the thermal camera arrangement may track the movement of the magnet and measure the temperature of the magnet. Typically, the thermal camera arrangement is not in physical contact with the magnet and, hence, performs a non-contact temperature measurement of the magnet, e.g., substantially in real-time. FIG. 2 is a diagrammatic representation of a stage apparatus that includes a thermal camera arrangement which provides a non-contact temperature measurement associated with a magnetic actuator in accordance with an embodiment of the present invention. A stage apparatus 200, which may be a wafer stage apparatus or a reticle stage apparatus, includes an actuator 204 and a control arrangement 216. Actuator 204, which may be an electromagnetic actuator, includes a magnet 208. Control arrangement 216 is arranged to control actuator 204, and may be used to adjust an amount of current provided to actuator 204.

A thermal camera arrangement 212 is arranged to effectively track magnet 208 while magnet 208 translates or otherwise moves. Thermal camera arrangement 212 may also effectively track magnet 208 as a different portion of magnet 208 is used to generate force, e.g., in a moving coil actuator. For instance, thermal camera arrangement 212 may be arranged substantially over magnet 208. Thermal camera arrangement 212 may be a high-resolution IR imager, as mentioned above. The image resolution associated with such a high-resolution IR imager may vary widely, e.g., may be approximately 320 by approximately 256 pixels or higher.

Control arrangement 216 may provide thermal camera arrangement 212 with information which allows thermal camera arrangement 212 to follow the movement of magnet 208 or, more generally, actuator 204. Such information may be actuator position data, or data that identifies the current position of actuator 204, provided by stage control logic (not shown) of control arrangement 216.

Magnet 208 may undergo temperature changes. That is, the temperature of magnet 208 may rise and fall while actuator 204 is active. Thermal camera arrangement 212 is arranged to measure the temperature of magnet 208 substantially in real-time. By way of example, as thermal camera arrangement 212 tracks magnet 208, thermal camera arrangement 212 measures the temperature of magnet 208.

The temperature of magnet 208 may be measured at one location on magnet 208. Alternatively, temperature measurements may be made at various locations on magnet 208, and an average or median temperature may be determined using the temperature measurements. Such an average or median temperature may then be considered to be the measured temperature of magnet 208.

The measured temperature of magnet 208 is provided by thermal camera arrangement 212 to control arrangement 216. Using the measured temperature of magnet 208, control arrangement 216 may determine a suitable amount of current to apply to actuator 204 to adjust for temperature-induced chances in the force constant of actuator 204. In other words, control arrangement 216 may adjust the amount of current applied to actuator 204 based upon the temperature measurements provided by thermal camera arrangement 212 to maintain a substantially constant value for an actuator force constant. Logic associated with control arrangement 216 may calculate an amount of current that is effectively needed to maintain an output force of actuator 204 at a desired value, given the temperature of magnet 208 as measured by thermal camera arrangement 212.

It should be appreciated that stage apparatus 200 may be pre-calibrated to identify how much adjustment to the actuator current is needed by actuator 204 in order to compensate for actuator force constant changes at particular temperatures. Typically this adjustment is a gain by which the normal current command is multiplied. The various gains needed to compensate for actuator force constant changes at particular temperatures may be stored in a data structure (not shown) such that they are accessible to control arrangement 216. Hence, when thermal camera arrangement 212 provides a temperature measurement to control arrangement 216, control arrangement 216 may access the data structure (not shown) to identify how much current is needed by actuator 204 to maintain a desired force. Control arrangement 216 may then adjust the amount of current applied to actuator 204 as needed to maintain the desired force. In other words, control arrangement 216 may effectively "look up" how to adjust the current applied to actuator 204, given the temperature of magnet 208 as measured by thermal camera arrangement 212, in order to maintain a desired force.

Figure 3:
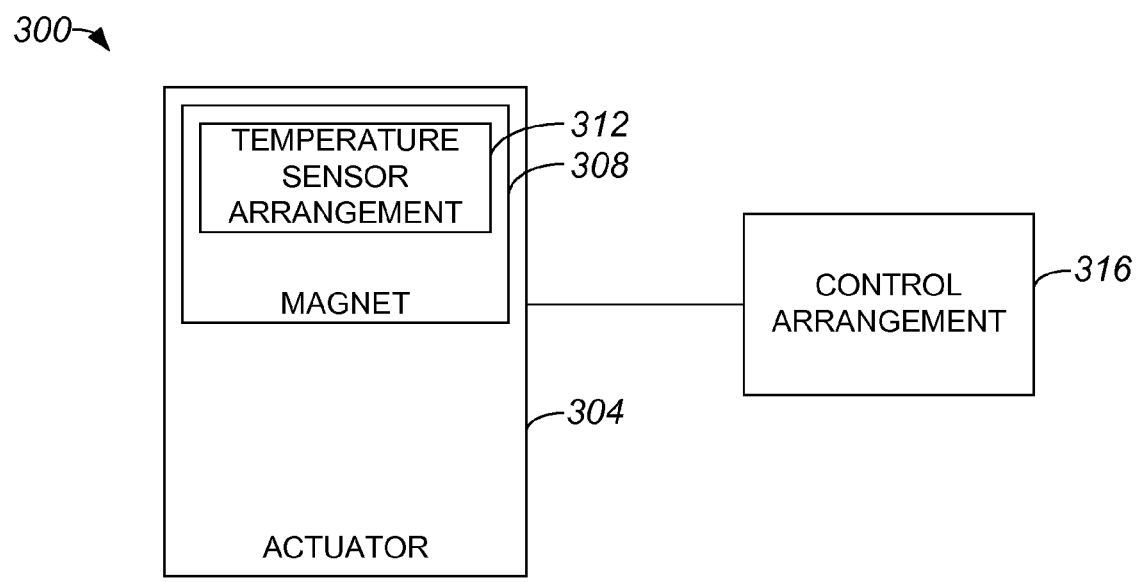
FIG. 3 is a diagrammatic representation of a stage apparatus that includes a temperature sensor arrangement which provides a contact temperature measurement associated with a magnetic actuator in accordance with an embodiment of the present invention.

While a temperature sensing arrangement may be a thermal camera arrangement, or, more generally, an arrangement that does not contact a magnet which is being monitored, a temperature sensing arrangement may instead be arranged to contact a magnet. For example, a temperature sensing arrangement may be a temperature sensor arrangement which is configured to maintain contact with a magnet. FIG. 3 is a diagrammatic representation of a stage apparatus that includes a temperature sensor arrangement which provides a temperature measurement associated with a magnetic actuator in accordance with an embodiment of the present invention. A stage apparatus 300 includes an actuator 304 and a control arrangement 316. Actuator 304, which may be an electromagnetic actuator, includes a magnet 308 that is in substantially direct contact with a temperature sensor arrangement 312. Control arrangement 316 is arranged to control actuator 304, and may be used to adjust an amount of current provided to actuator 304.

Temperature sensor arrangement 312, e.g., a thermistor, is generally configured to either measure an actual temperature of magnet 308, or an amount by which the temperature of magnet 308 has changed. Once temperature sensor arrangement 312 has a temperature measurement, the temperature measurement is provided to control arrangement 316. Control arrangement 316 uses the temperature measurement to adjust the amount of current provided to actuator 304, as appropriate, such that a desired force may be maintained. As mentioned above with respect to FIG. 2, control arrangement 316 may have access to data (not shown) which essentially correlates magnet temperatures to changes in the amount of current needed by actuator 304 in order to maintain a desired actuator force. The data may be stored in a data structure (not shown) as a compensation map. Such a compensation map may store information relating to how much current is needed by actuator 304 at particular temperatures to compensate for changes in the actuator force constant. Control arrangement 216 may access the data structure (not shown) to identify how much current is to be provided to actuator 304 such that a desired force constant may be maintained. Control arrangement 316 may adjust the amount of current provided to actuator 304 as needed to maintain the desired force constant.

Figure 4:
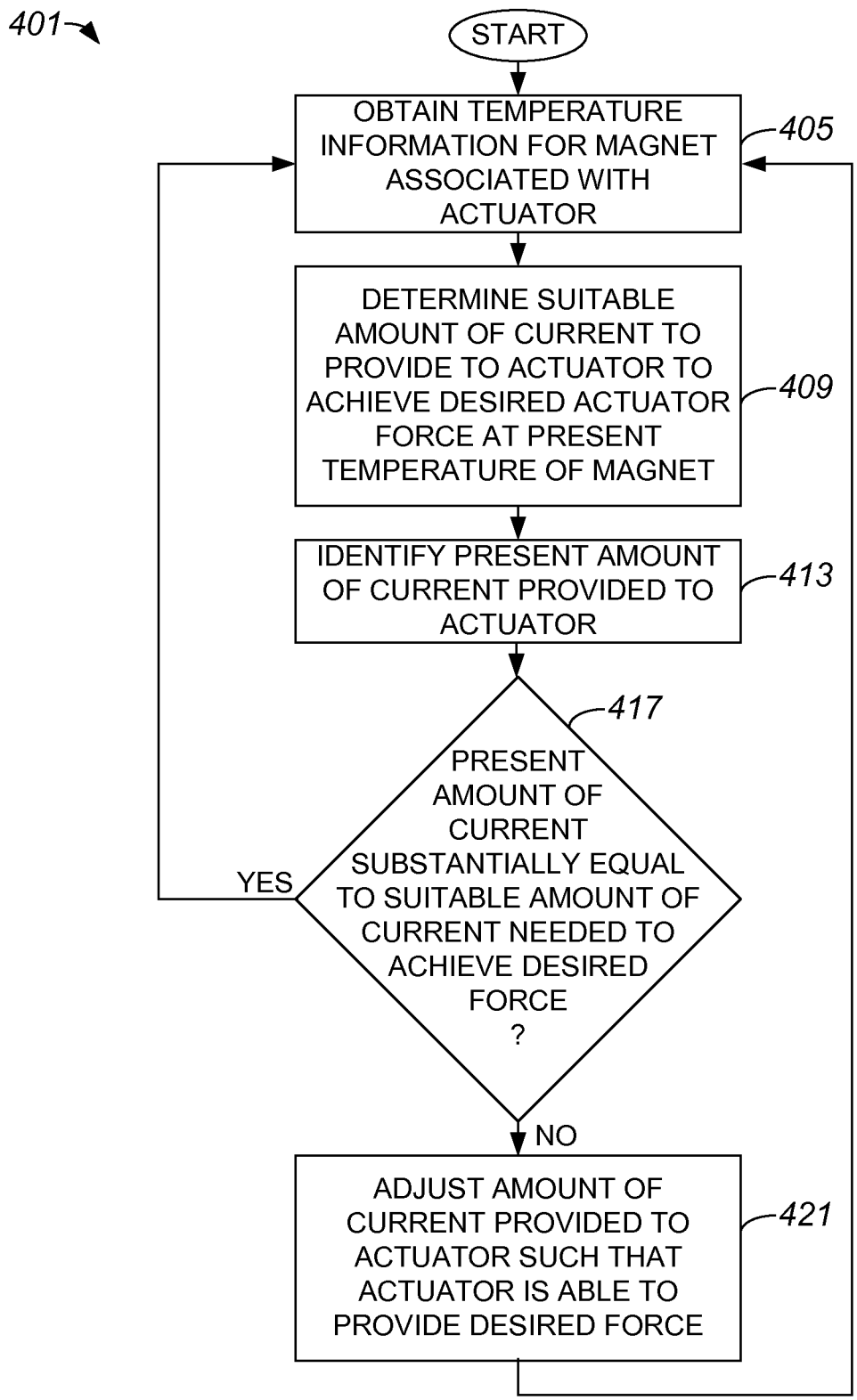
FIG. 4 is a process flow diagram which illustrates a method of compensating for temperature effects in a magnetic actuator in accordance with an embodiment of the present invention.

With reference to FIG. 4, one method of compensating for temperature effects in a magnetic actuator, e.g., a permanent magnet electromagnetic actuator, will be described from the point-of-view of a control arrangement in accordance with an embodiment of the present invention. A process 401 of compensating for temperature effects begins at step 405 in which temperature information for a magnet of an actuator is obtained by a control arrangement. Such information may be a real-time, e.g., current, temperature measurement obtained from a thermal camera arrangement or a temperature sensor arrangement.

Once temperature information is obtained, a suitable amount of current to provide to the actuator such that a desired force may be maintained at the current temperature is determined in step 409. In other words, the amount of electrical current to provide to the actuator at the present measured temperature of a magnet of the actuator that allows the actuator force to match a desired value is determined. The amount of current to provide to the actuator may be determined using a stored compensation map, as mentioned above. The stored data may indicate an amount of current to provide to an actuator at a given temperature to achieve a particular actuator force constant.

From step 409, process flow moves to step 413 in which the actual amount of current that is flowing to the actuator is identified. As will be appreciated by those skilled in the art, this step may be accomplished through the use of a current-sensing resistor in a power amplifier. After the amount of current that is currently provided to the actuator is identified, a determination is made in step 417 regarding whether the present amount of current provided to the actuator is substantially equal to the amount of current that is effectively needed to achieve the desired force. That is, it is determined whether the amount of current provided to the actuator is to be adjusted to maintain the desired force.

If the determination in step 417 is that the present amount of current is substantially correct to achieve the desired force at the present temperature, then process flow returns to step 405 in which temperature information for the magnet associated with the actuator is obtained. Alternatively, if it is determined in step 417 that the present amount of current is not substantially equal to the amount of current substantially needed to achieve the desired force constant, the indication is that the amount of current provided to the actuator is to be adjusted. Accordingly, in step 421, the amount of current provided to the actuator is adjusted such that the actuator is able to maintain or otherwise provide the desired force constant. It should be appreciated that adjusting the amount of current typically includes identifying an amount by which the current presently being provided to the actuator is to be increased or decreased such that the actuator force may be maintained at a desired level. In one embodiment, steps 417 and 421 may be implemented through the use of a current-control feedback loop within a power amplifier. Once the amount of current is adjusted, process flow returns to step 405 in which temperature information for the magnet associated with the actuator is obtained.

As previously mentioned, information which identifies an amount of current to provide to an actuator to achieve a particular force at a particular temperature may be stored in a data structure such as a compensation map. FIG. 5 is a diagrammatic representation of a compensation map or table in accordance with an embodiment of the present invention. A compensation map 550, which may be stored in a database or memory associated with a controller of a stage apparatus, is arranged to effectively provide mappings which may be used to control an actuator such that a desired force constant may be maintained with respect to the actuator. Compensation map 550 maps magnet temperatures 558 to force constants 554 and compensating current gains 562. The control arrangement, e.g., control arrangement 216 or control arrangement 316, uses magnet temperatures 558 or measured temperature data to lookup within compensation map 550. At a particular temperature, the compensation map 550 provides an expected motor force constant 554, which typically has a temperature-induced deviation from a nominal value, and a compensating current gain 562. When a nominal current command is multiplied by compensating current gain 562, a modified current command is generated. Subsequently, a modified current may sent to an actuator, thereby producing a desired force. In other words, the compensating current gain 562 compensates for a change in an actuator force constant 554 caused by a fluctuating temperature.

Figure 6:
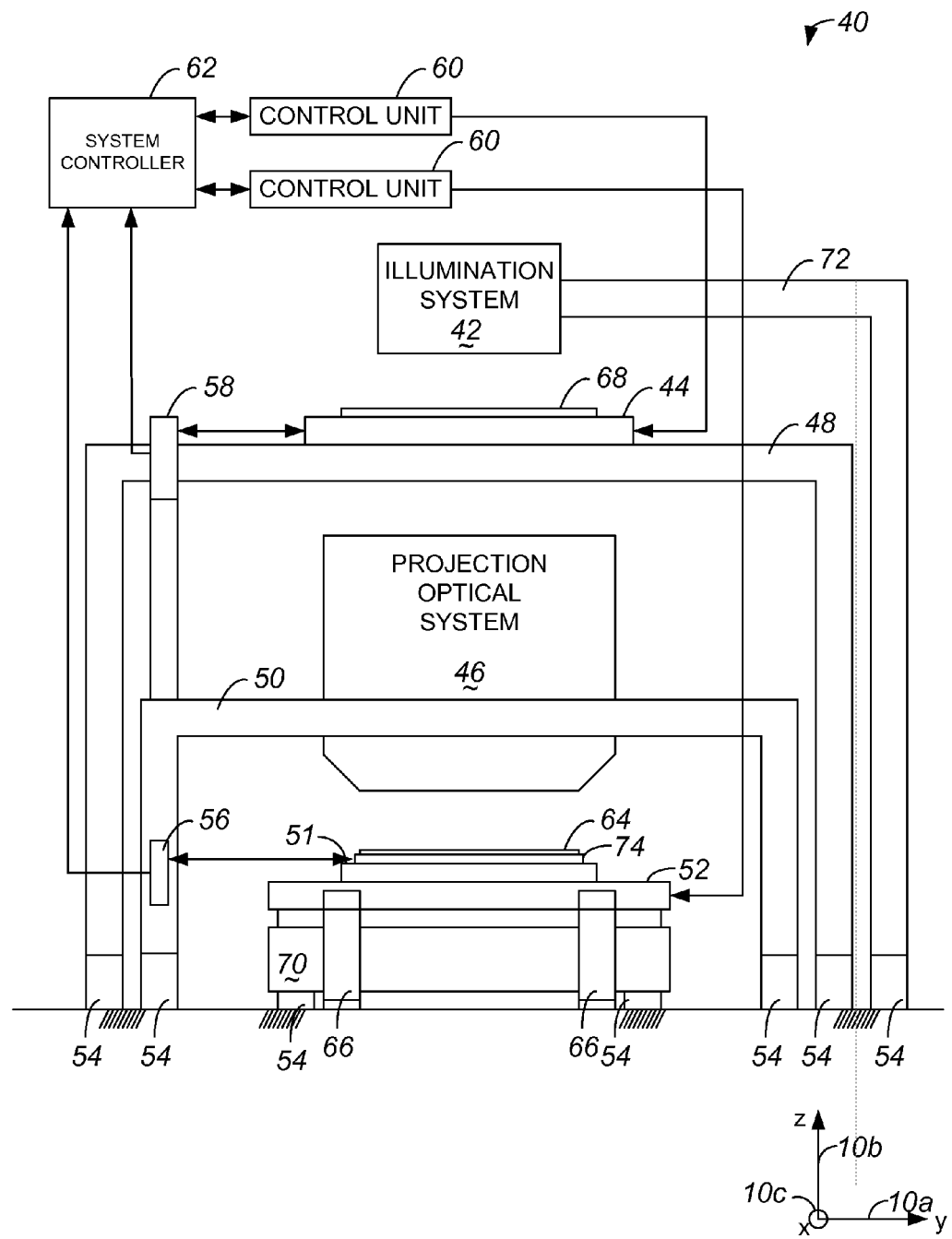
FIG. 6 is a diagrammatic representation of a photolithography apparatus in accordance with an embodiment of the present invention.

With reference to FIG. 6, a photolithography apparatus which may include the capability of substantially measuring the temperature of magnets, e.g., permanent magnets, in actuators will be described in accordance with an embodiment of the present invention. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator, e.g., an EI-core actuator with a top coil and a bottom coil which are substantially independently controlled. The planar motor which drives wafer positioning stage 52 generally uses an electromagnetic force generated by magnets and corresponding armature coils arranged in two dimensions. The temperature of the magnets of the planar motor may be measured by a thermal camera and/or a temperature sensor, as discussed above. It should be appreciated that although planar motors and EI-core actuators are described, the present invention is not limited to use with planar motors. For example, the present invention may be applied to linear motors.

A wafer 64 is held in place on a wafer holder or chuck 74 which is coupled to wafer table 51. Wafer positioning stage 52 is arranged to move in multiple degrees of freedom, e.g., in up to six degrees of freedom, under the control of a control unit 60 and a system controller 62. In one embodiment, wafer positioning stage 52 may include a plurality of actuators and have a configuration as described above. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In one described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, which may provide a beam of light that may be reflected off of a reticle. In one embodiment, illumination system 42 may be arranged to project a radiant energy, e.g., light, through a mask pattern on a reticle 68 that is supported by and scanned using a reticle stage 44 which may include a coarse stage and a fine stage, or which may be a single, monolithic stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an F2-type laser (157 nm). Alternatively, illumination system 42 may also use charged particle beams such as x-ray and electron beams. For instance, in the case where an electron beam is used, thermionic emission type lanthanum hexaboride (LaB6) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser are used, glass materials such as quartz and fluorite that transmit far ultra-violet rays is preferably used. When either an F2-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

The present invention may be utilized, in one embodiment, in an immersion type exposure apparatus if suitable measures are taken to accommodate a fluid. For example, PCT patent application WO 99/49504, which is incorporated herein by reference in its entirety, describes an exposure apparatus in which a liquid is supplied to a space between a substrate (wafer) and a projection lens system during an exposure process. Aspects of PCT patent application WO 99/49504 may be used to accommodate fluid relative to the present invention.

Figure 7:
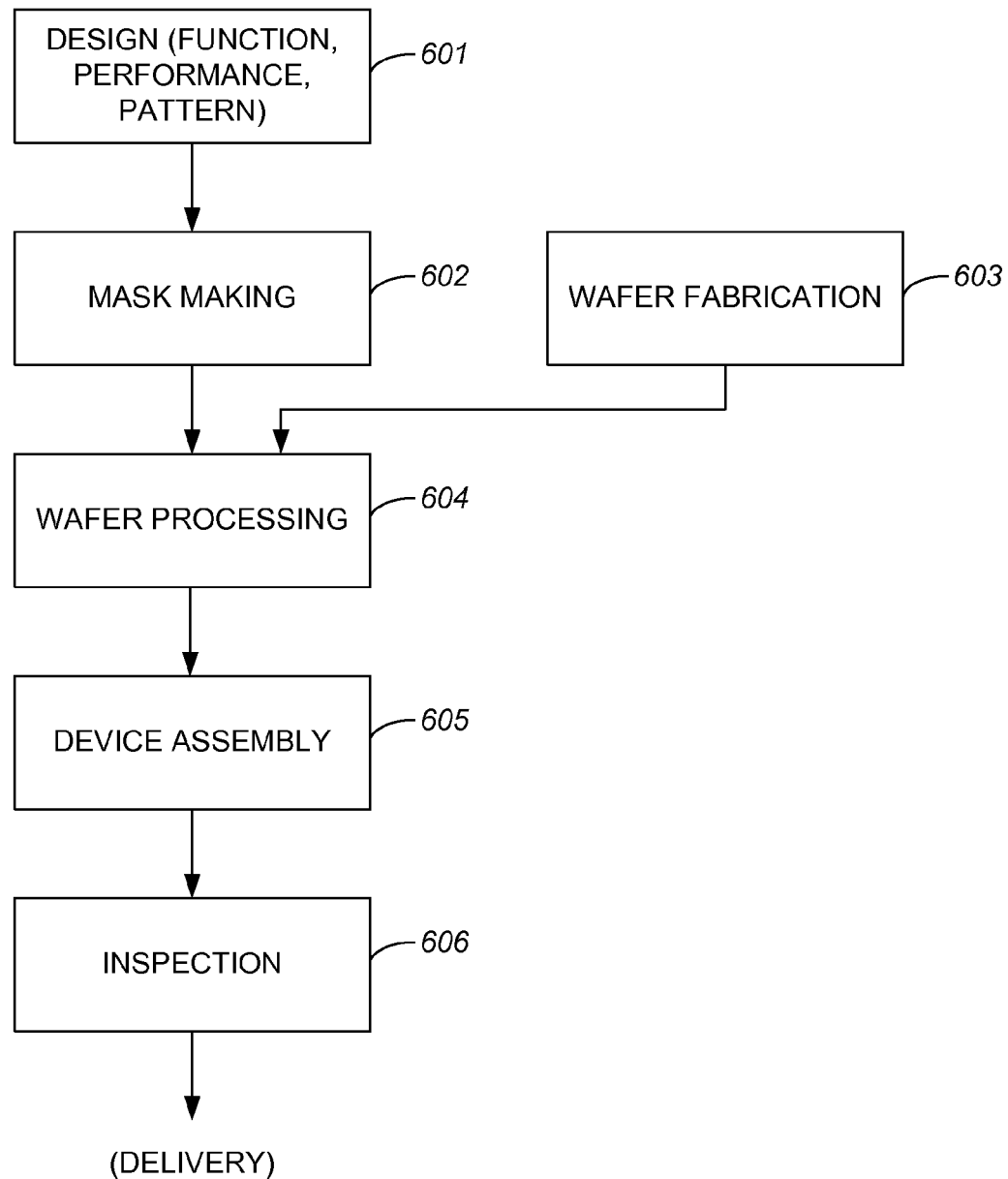
FIG. 7 is a process flow diagram which illustrates the steps associated with fabricating a semiconductor device in accordance with an embodiment of the present invention.

Further, semiconductor devices may be fabricated using systems described above, as will be discussed with reference to FIG. 7. FIG. 7 is a process flow diagram which illustrates the steps associated with fabricating a semiconductor device in accordance with an embodiment of the present invention. A process 601 of fabricating a semiconductor device begins at step 603 in which the function and performance characteristics of a semiconductor device are designed or otherwise determined. Next, in step 605, a reticle or mask in which has a pattern is designed based upon the design of the semiconductor device. It should be appreciated that in a substantially parallel step 609, a wafer is typically made from a silicon material. In step 613, the mask pattern designed in step 605 is exposed onto the wafer fabricated in step 609. One process of exposing a mask pattern onto a wafer will be described below with respect to FIG. 8. In step 617, the semiconductor device is assembled. The assembly of the semiconductor device generally includes, but is not limited to including, wafer dicing processes, bonding processes, and packaging processes. Finally, the completed device is inspected in step 621. Upon successful completion of the inspection in step 621, the completed device may be considered to be ready for delivery.

Figure 8:
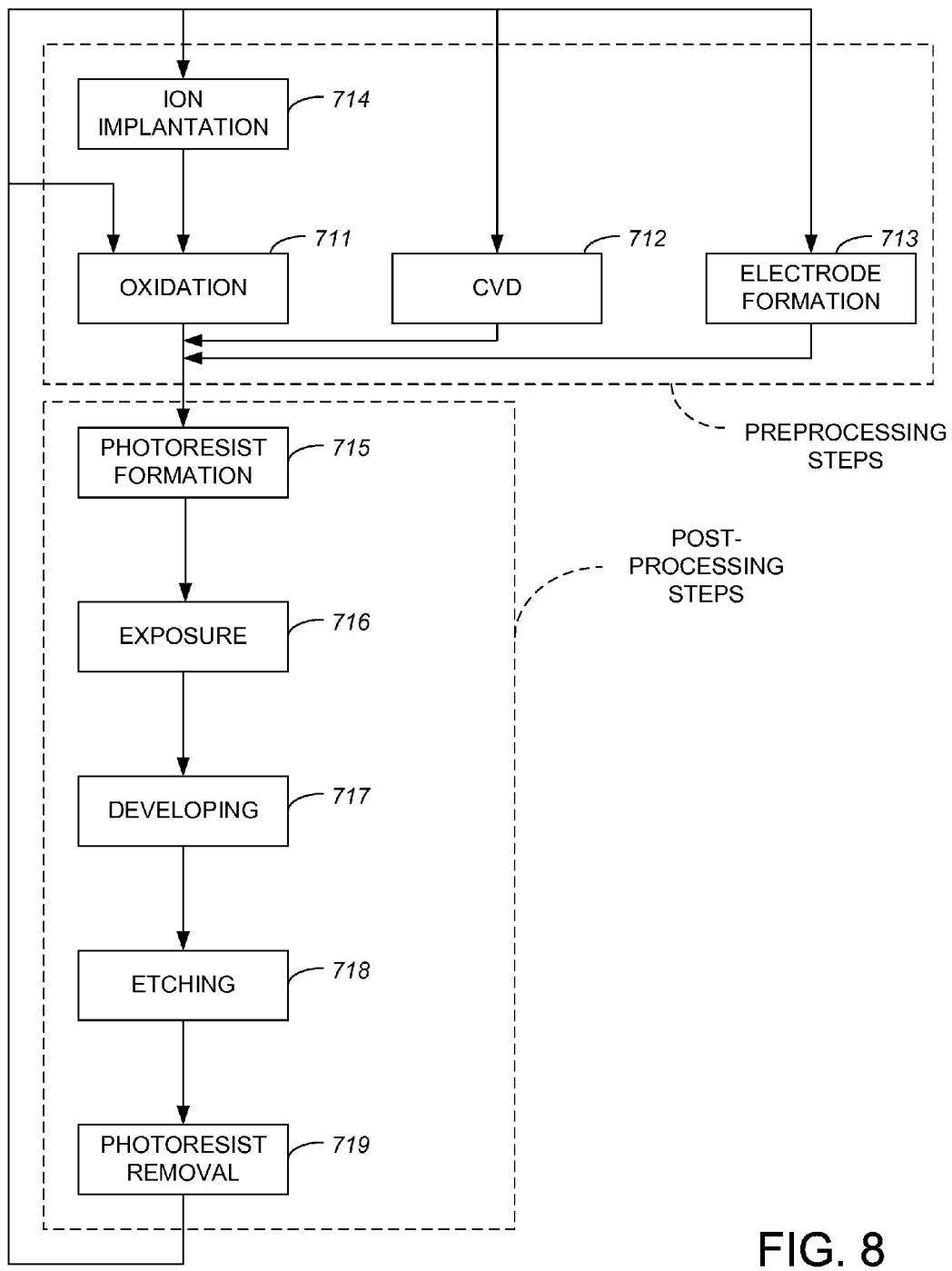
FIG. 8 is a process flow diagram which illustrates the steps associated with processing a wafer, i.e., step 604 of FIG. 7, in accordance with an embodiment of the present invention.

FIG. 8 is a process flow diagram which illustrates the steps associated with wafer processing in the case of fabricating semiconductor devices in accordance with an embodiment of the present invention. In step 701, the surface of a wafer is oxidized. Then, in step 705 which is a chemical vapor deposition (CVD) step in one embodiment, an insulation film may be formed on the wafer surface. Once the insulation film is formed, then in step 709, electrodes are formed on the wafer by vapor deposition. Then, ions may be implanted in the wafer using substantially any suitable method in step 713. As will be appreciated by those skilled in the art, steps 701-713 are generally considered to be preprocessing steps for wafers during wafer processing. Further, it should be understood that selections made in each step, e.g., the concentration of various chemicals to use in forming an insulation film in step 705, may be made based upon processing requirements.

At each stage of wafer processing, when preprocessing steps have been completed, post-processing steps may be implemented. During post-processing, initially, in step 717, photoresist is applied to a wafer. Then, in step 721, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 725. Once the exposed wafer is developed, parts other than residual photoresist, e.g., the exposed material surface, may be removed by etching in step 729. Finally, in step 733, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, thermal cameras and temperature sensor arrangements have been described as being suitable for use in providing temperature measurements associated with magnets in actuators. In general, any suitable arrangements which are capable of determining temperatures of magnets in actuators, and providing the determined temperatures to a controller of a stage apparatus, may be used.

While thermal cameras such as IR cameras may be used to provide temperature information associated with an actuator, substantially any relatively high-resolution imagers that are capable of performing real-time non-contact temperature measurements may generally be used. For instance, a single pixel IR sensor may be used to effectively identify the temperature of a magnet. In one embodiment, if a single pixel IR sensor is used, the single pixel IR sensor is aimed or otherwise positioned to essentially monitor the magnet.

Temperature sensor arrangements may be used to measure the temperature associated with an actuator may include sensors which are capable of performing real-time contact temperature measurements. Such sensors may include, but are not limited to including, thermistors, thermocouples, electronic thermometers, and resistance temperature detectors (RTDs).

While the temperature of each magnet or, more generally, each component that is formed from a magnetic material, may be determined substantially separately, it should be appreciated that an overall average temperature of multiple magnets may instead be determined. When the temperature of a magnet is measured, the current provided to the actuator associated with the magnet may be adjusted based on specific temperature measurement such that the force generated by the actuator remains at a desired level. Alternatively, when an overall average temperature of multiple magnets is effectively measured, the current provided to the actuators associated with the multiple magnets may be adjusted based on the average temperature.

The operations associated with the various methods of the present invention may vary widely. By way of example, steps may be added, removed, altered, combined, and reordered without departing from the spirit or the scope of the present invention.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An apparatus comprising:
an actuator, the actuator having at least a magnet;
a temperature sensing arrangement, the temperature sensing arrangement being arranged to determine a temperature of the magnet; and
a control arrangement, the control arrangement being arranged to adjust a current provided to the actuator based on the temperature of the magnet, wherein the current is adjusted to maintain a force generated by the actuator when the temperature of the magnet varies, and wherein the control arrangement is arranged to adjust the current provided to the actuator based on the temperature of the magnet by identifying a gain and adjusting the current provided to the actuator using the gain.

2. The apparatus of claim 1 wherein the temperature sensing arrangement is configured to measure the temperature of the magnet in real-time and to provide the temperature of the magnet to the control arrangement, wherein the control arrangement is arranged to adjust the current provided to the actuator using the gain by multiplying a current command by the gain.

3. The apparatus of claim 1 wherein the temperature sensing arrangement is an infra-red (IR) sensor.

4. The apparatus of claim 3 wherein the IR sensor is an IR camera positioned at a distance from the magnet.

5. The apparatus of claim 1 wherein the temperature sensing arrangement is a temperature sensor, the temperature sensor being arranged to contact the magnet.

6. The apparatus of claim 5 wherein the temperature sensor is one selected from the group including a thermistor, a thermocouple, an electronic thermometer, and a resistance temperature detector (RTD).

7. The apparatus of claim 1 further including:
a stage, wherein the actuator is arranged to cause the stage to move.

8. A stage apparatus comprising the apparatus of claim 1

9. An exposure apparatus comprising the stage apparatus of claim 8.

10. The apparatus of claim 1 wherein the magnet has an associated force constant that varies with the temperature of the magnet, and wherein the gain is selected to compensate for variations in the associated force constant.

11. A stage apparatus comprising:
a stage;
a magnetic actuator, the magnetic actuator including at least a magnet and having an actuator force constant, the magnetic actuator being coupled to the stage and configured to cause the stage to move;
a temperature sensing arrangement, the temperature sensing arrangement being configured to measure a temperature associated with the magnet; and
a control arrangement, the control arrangement being arranged to provide an amount of current to the magnetic actuator, wherein the control arrangement is further arranged to obtain the temperature measured by the temperature sensing arrangement and to adjust the amount of current provided to the magnetic actuator based on the temperature measured by the temperature sensing arrangement to maintain an actuator force at a desired value in light of temperature-induced changes in the force constant, wherein the control arrangement is pre-calibrated to adjust the amount of current provided by a particular amount to compensate for the temperature-induced changes in the force constant at a particular temperature.

12. The stage apparatus of claim 11 wherein the temperature sensing arrangement is configured to track movement of the magnet.

13. The stage apparatus of claim 11 wherein the temperature sensing arrangement is an infra-red (IR) sensor.

14. The stage apparatus of claim 13 wherein the IR sensor is an IR camera.

15. The stage apparatus of claim 11 wherein the temperature sensing arrangement is directly coupled to the magnet, the temperature sensing arrangement being one selected from the group including a thermistor, a thermocouple, an electronic thermometer, and a resistance temperature detector (RTD).

16. The stage apparatus of claim 11 wherein the stage is one selected from the group including a wafer stage and a reticle stage.

17. An exposure apparatus comprising the stage apparatus of claim 11.

18. A method for operating a stage apparatus, the stage apparatus including an actuator having a magnet, the method comprising:
determining a temperature of the magnet;
determining an amount of current to provide to the actuator based on the temperature of the magnet, wherein the amount of current is arranged to enable the actuator to sustain an actuator force at a desired value when a value of an actuator force constant changes with a temperature; and providing the amount of current to the actuator.

19. The method of claim 18 wherein the stage apparatus includes a temperature sensing arrangement and the temperature of the magnet is an average temperature of the magnet, and wherein determining the temperature of the magnet includes measuring a first temperature of the magnet at a first location on the magnet using the temperature sensing arrangement, measuring a second temperature of the magnet at a second location on the magnet using the temperature sensing arrangement, and determining the average temperature of the magnet using the first temperature and the second temperature.

20. The method of claim 19 wherein the temperature sensing arrangement is a thermal camera.

21. The method of claim 19 wherein the temperature sensing arrangement includes a temperature sensor that is in direct contact with the magnet.

22. The method of claim 19 wherein the magnet is a permanent magnet.

* * * * *